United States Patent
Yamamoto et al.

(10) Patent No.: US 6,335,863 B1
(45) Date of Patent: *Jan. 1, 2002

(54) PACKAGE FOR SEMICONDUCTORS, AND SEMICONDUCTOR MODULE THAT EMPLOYS THE PACKAGE

(75) Inventors: Yoshiyuki Yamamoto; Hirohisa Saito; Takahiro Imai, all of Itami (JP)

(73) Assignee: Sumitomo Electric Industries, Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/228,423

(22) Filed: Jan. 12, 1999

(30) Foreign Application Priority Data

Jan. 16, 1998 (JP) .......................................... 10-006238
Mar. 30, 1998 (JP) .......................................... 10-084233

(51) Int. Cl.⁷ ................................................ H05K 7/20
(52) U.S. Cl. ........................ 361/719; 361/710; 361/714; 257/717; 165/80.3
(58) Field of Search ............................ 361/700–710, 361/714–722, 807–812; 257/700, 707, 702, 705, 759, 701, 732, 787, 664, 687, 796, 706–727; 165/164, 170, 180, 185, 80.2, 80.3, 80.4, 165; 174/16.3, 252, 15.1, 15.2; 428/210, 220, 446, 408, 36.3, 212, 338, 367, 370, 372, 312

(56) References Cited

U.S. PATENT DOCUMENTS

| | | | |
|---|---|---|---|
| 3,641,398 A | | 2/1972 | Fitzgerald, Jr. |
| 3,678,995 A | * | 7/1972 | Collard ........................ 165/185 |
| 3,753,056 A | * | 8/1973 | Cooke ..................... 317/234 R |
| 3,974,518 A | * | 8/1976 | Lewis et al. .................... 357/81 |
| 4,425,195 A | * | 1/1984 | Papanicolaou .................. 204/3 |
| 4,566,027 A | * | 1/1986 | Heitzmann et al. ............ 357/81 |
| 4,788,627 A | | 11/1988 | Ehlert et al. |
| 5,309,163 A | * | 5/1994 | Ngan et al. .................. 343/700 |
| 5,602,720 A | | 2/1997 | Natsuhara et al. |
| 5,682,063 A | * | 10/1997 | Yamamoto et al. .......... 257/700 |
| RE35,845 E | * | 7/1998 | Butera ......................... 257/702 |
| 5,858,537 A | * | 1/1999 | Brown et al. ................ 428/408 |

FOREIGN PATENT DOCUMENTS

| | | | | | |
|---|---|---|---|---|---|
| JP | 360007742 A | * | 1/1985 | ........... | H01L/23/12 |
| JP | 60226143 | | 11/1985 | | |
| JP | 401216561 A | * | 8/1989 | ........... | H01L/23/14 |
| JP | 401317197 A | * | 12/1989 | ........... | C30B/29/04 |
| JP | 4-343232 | | 11/1992 | | |
| JP | 7-99268 | | 4/1995 | | |
| WO | WO 95/14330 | | 5/1995 | | |
| WO | WO 97/05757 | | 2/1997 | | |

* cited by examiner

Primary Examiner—Leo P. Picard
Assistant Examiner—Michael Datskovsky
(74) Attorney, Agent, or Firm—McDermott, Will & Emery

(57) ABSTRACT

A low-cost package for semiconductors that is superior in heat dissipation and capable of preventing the cracking of semiconductor elements at the time of mounting, and a semiconductor module employing the package. The package for semiconductors comprises a CVD diamond substrate 22 made of an independent diamond lamina, and a highly heat-conductive metallic member 21 bonded with the substrate. Semiconductor elements such as MMICs are mounted on an area 25 for mounting semiconductor elements. The CVD diamond substrate 22 may be replaced by a composite in which a CVD diamond layer is formed on a base material having thermal conductivity of 100 W/m·K or more. The provision of protuberances 26 of the metallic member 21 around the CVD diamond substrate 22 prevents the leakage of microwaves and millimeter waves.

5 Claims, 4 Drawing Sheets

(a)

(b)

(a)

(b)

PRIOR ART

PACKAGE FOR SEMICONDUCTORS, AND SEMICONDUCTOR MODULE THAT EMPLOYS THE PACKAGE

BACKGROUND OF THE INVENTION

1. Field of the Invention

The present invention relates to a package for semiconductors, and more specifically to a highly heat-dissipating package for semiconductors that is used to mount high-output, highly heat-generative elements such as high-output transistors and microwave monolithic ICs (MMICs). The present invention further relates to a semiconductor module that mounts a semiconductor element or semiconductor elements on the package.

2. Description of the Background Art

As the output of semiconductor elements and operating frequencies increases, the heat generated by these elements increases. Great market demands for the miniaturization and reduction of weight of electronic devices cause the continual increase in the density of semiconductor elements. The increase in the heat generated by semiconductor elements combined with the mounting density further intensifies the need requirement for improving the heat dissipating characteristic of modules that mount these semiconductor elements.

Modules required to have such a high heat dissipation have a substrate comprising highly heat-conductive materials as the heat sink to mount semiconductor elements and effectively dissipate the heat from the elements, so as to prevent overheating of the elements. (See U.S. Pat. No. 4,788,627 and unexamined Japanese patent application Tokukaihei 7-99268.) The substrate is then bonded onto a metallic member, and sealed hermetically as required.

A typical example of a semiconductor for package which is used for such a conventional semiconductor module is shown in FIGS. 3 and 4. FIG. 3 shows a perspective view of the package for semiconductors. FIG. 4(a) is a sectional view of the package shown in FIG. 3, and FIG. 4(b) a plan view. Mounted on a metallic member 11, a substrate 12 has an area 15 for mounting semiconductor elements on the top thereof. The area 15 is surrounded by via holes 14 that are electrically connected to the metallic member 11 below. Lead frames 13 are attached to edge portions opposite each other on the substrate 12 through metallized layers 16.

In conventional semiconductor modules, beryllia (BeO) has been widely used as a substrate for mounting high-output transistors, MMICs, or other high-output semiconductor elements that generate a large amount of heat, because BeO has superior heat conductivity and dielectric characteristics.

However, the above-described circumstances, the continual increase in the heat generated by semiconductor elements and in mounting density, cause even semiconductor modules employing highly heat-conductive BeO as the substrate to become insufficient in heat dissipation. Although an attempt is made to lower the thermal resistance by reducing the thickness of the BeO substrate, the thickness has already reached its lower limit considering that BeO itself has poor machinability as well as toxicity.

Diamond, on the other hand, has a higher thermal conductivity than any other substances and is an ultimate material for reducing the heat resistance of the semiconductor modules described above. It also has a comparable dielectric characteristic to that of conventional substrate materials such as BeO, alumina, and AlN. (See unexamined Japanese patent application Tokukaihei 4-343232.) Diamond, however, is too expensive to meet the requirement that these modules must employ components at minimal cost.

Diamond has another drawback in that it has a smaller coefficient of thermal expansion than a semiconductor element, so that cracks tend to develop in a semiconductor element during the soldering process for mounting the element on a diamond substrate. When an MMIC is to be mounted, via holes are provided in the substrate to reduce the inductance of the grounding circuit of the device. Due to diamond's poor machinability, machining cost increases drastically. In addition, when lead frames are attached to diamond directly, the lead frames are easily detached due to weak bonding between the lead frames and diamond.

SUMMARY OF THE INVENTION

In consideration of the foregoing circumstances, it is an object of the present invention to provide a low-cost package for semiconductors and a semiconductor module employing the package that is free from toxicity, safe in production, superior in heat dissipation, and able to prevent the cracking of semiconductor elements at the time of mounting.

In order to fulfill the above object, the present invention provides a package for semiconductors that comprises a chemical vapor-deposition (CVD) diamond substrate for mounting semiconductor elements on top of it and a highly heat-conductive metallic member bonded with the diamond substrate at the substrate's surface opposite to that for mounting semiconductor elements, the metallic member having protuberances around the diamond substrate, with the protuberances reaching the top of the diamond substrate.

The present invention further provides another package for semiconductors that comprises a base material, having thermal conductivity of 100 W/m·K or more, for mounting semiconductor elements; a CVD diamond layer formed on a part or the whole of the base material's surface at the side for mounting semiconductor elements; and a highly heat-conductive metallic member bonded with the base material at the base material's surface opposite to that for mounting semiconductor elements, the metallic member having protuberances around the base material provided with the diamond layer, with the protuberances reaching the top of the diamond layer. In this case, it is desirable that the base material comprise at least one kind selected from the group consisting of Si, AlN, SiC, Cu—W alloy, Cu—Mo alloy, and Cu—W—Mo alloy.

In either of the foregoing packages for semiconductors, a ceramic member made of or mainly consisting of alumina ($Al_2O_3$) may be provided at the bonding places of the lead frames for the package. On the surface for mounting semiconductor elements of the CVD diamond substrate or layer, laminated wiring layers comprising a plurality of combinations of an insulating layer having a dielectric constant of 5 or less and a metallic wiring layer may be formed.

The semiconductor module offered by the present invention mounts a high-output semiconductor element or high-output semiconductor elements on the surface for mounting semiconductor elements of the CVD diamond substrate or the CVD diamond layer formed on the top of the base material of the above-described packages for semiconductors.

The present invention, employing the CVD diamond substrate or the highly heat-conductive base material having the CVD diamond layer on it as the substrate for mounting semiconductor elements, provides a package for semiconductors that is safe in production due to the exclusion of toxic BeO, superior in heat dissipation with low thermal resistance, and able to prevent the cracking of a semiconductor element at the time of mounting.

Particularly, the substrate for mounting semiconductor elements that has a thin CVD diamond layer on the highly heat-conductive base material causes the effective coefficient of thermal expansion of the top region to increase, more reliably preventing the cracking of semiconductor elements mounted on the same.

The provision of protuberances on the metallic member facilitates the extension of the ground potential with low inductance, and enables the production of semiconductor modules free from leakage of microwaves and millimeter waves, providing an environment where even high-output, highly heat-generating semiconductor elements such as MMICs operate stably.

DETAILED DESCRIPTION OF THE INVENTION

For a substrate for mounting semiconductor elements, the present invention employs either a CVD diamond substrate made of an independent diamond lamina formed by vapor-phase synthesis or a base material, having thermal conductivity of 100 W/m·K or more, with a CVD diamond layer formed on the surface thereof. The CVD diamond, which has been specially developed in recent years, can be synthesized with a larger area than natural diamond or diamond grown by high-pressure and high-temperature method, facilitating the cost reduction of semiconductor modules and packages. The bonding of the CVD diamond substrate or the base material, having the CVD diamond layer formed on the surface thereof, with a highly heat-conductive metallic member enables the reduction of the heat resistance of the package for semiconductors. It is desirable that the highly heat-conductive metallic member be made of Cu, Mo, Cu—W alloy, Cu—Mo alloy, or Cu—W—Mo alloy, for example. Clad materials thereof may also be used.

In the package for semiconductors of the present invention, it is desirable that the metallic member have protuberances around the CVD diamond substrate or the base material having the CVD diamond layer, the protuberances reaching the top of the CVD diamond substrate or layer. The fitting, and the bonding with the metallic member, of the CVD diamond substrate or the base material having the CVD diamond layer only on the inside of the protuberances enables the miniaturization of the portion made of the CVD diamond and the package itself, resulting in the cost reduction of the package. The protuberances prevent leakage of microwaves and millimeter waves, and provide the semiconductor elements to be mounted with easy access to the ground potential in place of via holes, enabling the realization of a high-performance package.

As mentioned above, as the substrate for mounting semiconductor elements in the present invention, the CVD diamond substrate may be an independent diamond lamina formed by vapor-phase synthesis. As for the thickness of the diamond lamina, if it is extremely thin, the highly heat-dissipating property of the diamond cannot be exploited, and if it is extremely thick, the total cost will increase. Consequently, it is desirable that the thickness of the CVD diamond substrate lie in the range of 50 to 700 $\mu$m, preferably in the range of 100 to 500 $\mu$m.

As the other embodiment of the present invention, the substrate for mounting semiconductor elements may comprise a base material having thermal conductivity of 100 W/m·K or more and a CVD diamond layer formed on a part or the whole of the top of the base material. It is desirable that the base material, having thermal conductivity of 100 W/m·K or more, comprise at least one kind selected from the group consisting of Si, AlN, SiC, Cu—W alloy, Cu—Mo alloy, and Cu—W—Mo alloy. It is also desirable that the thickness of the base material be in the range of 200 to 700 $\mu$m. It is desirable that the thickness of the CVD diamond layer formed on the base material be in the range of 5 to 200 $\mu$m, preferably in the range of 10 to 100 $\mu$m.

In this case, since the CVD diamond layer formed on the base material can be made thin as shown above, a package at much less cost is obtainable. In addition, the thin diamond layer on the base material causes the effective rate of thermal expansion of the region for mounting semiconductor elements to become considerably great in comparison with the CVD diamond substrate made of the independent diamond lamina, approaching that of the semiconductor elements. This therefore reduces the thermal stress generated in the semiconductor element, more effectively preventing the cracking of the semiconductor element when it is mounted.

The provision of a CVD diamond layer on the base material enables a highly effective dissipation of the heat generated by the semiconductor elements. More specifically, the heat generated at the semiconductor elements first diffuses laterally in the diamond layer of high thermal conductivity, and then propagates into the highly heat-conductive base material below through the whole area of the diamond layer. Thus, a highly heat-dissipating property is given to the package even with a thin CVD diamond layer. In order to obtain a superior lateral heat transfer in the diamond layer, it is desirable that the CVD diamond layer have thermal conductivity of 1000 W/m·K or more.

The present invention offers a package for semiconductors that has a metallized layer on the area for mounting semiconductor elements of the CVD diamond substrate or the CVD diamond layer on the base material. Onto this metallized layer, semiconductor elements are bonded by a soldering material. It is desirable that the metallized layer comprise at least one kind of metal selected from the group consisting of Au, Mo, Ni, Pt, Pd, Ti, Cu, and Al; an alloy thereof; or laminated layers thereof. It is desirable that the soldering material comprise at least one kind of metal selected from the group consisting of Au, Si, Ge, Sn, Pb, In, Ag, and Ti; or an alloy thereof. It is desirable that the total thickness of the metallized layer and soldered layer be in the range of 0.1 to 50 $\mu$m.

It is desirable that the lead-frame bonding zones of the package for semiconductors be provided with a ceramic member made of or mainly consisting of alumina. For instance, the CVD diamond substrate or the base material having the CVD diamond layer is bonded with the metallic member at the inside of the protuberances, and the ceramic member may be bonded with the metallic member at the outside of the protuberances to connect the lead frames through the metallized layers on the top of the ceramic member. Thus, besides the substrate for mounting semiconductor elements, the ceramic member for connecting lead frames is bonded with the metallic member, so that cost reduction may be achieved, and the lead frames may be attached easily with high bonding strength.

In the package for semiconductors of the present invention, the formation of laminated wiring layers, comprising a plurality of combinations of an insulating layer having a dielectric constant of 5 or less and a metallic wiring layer, on the surface for mounting semiconductor elements of the CVD diamond substrate or the CVD diamond layer on the base material further increases the mounting density of semiconductor elements. This contributes to the increase in operating frequency of the semiconductor module and to the miniaturization of packages and modules.

A low-cost, highly heat-dissipating semiconductor module may be constituted by mounting a high-output semiconductor element or high-output semiconductor elements on the CVD diamond substrate or layer of the package for semiconductors of the present invention. The module is suitable for mounting a high-output semiconductor element or high-output semiconductor elements mainly consisting of gallium arsenide or Si, in particular high-output transistors or MMICs. It is desirable that a high-output semiconductor element's surface opposite to the heat-generating zone be bonded with the CVD diamond substrate or the CVD diamond layer on the base material.

As mentioned above, employing CVD diamond as the substrate for mounting semiconductor elements enables the production of a package for semiconductors that is superior in heat dissipation with low thermal resistance, the package having the CVD diamond substrate or the base material with the CVD diamond layer formed on it as the heat sink. The semiconductor module that mounts a semiconductor element or semiconductor elements on the package for semiconductors provides an environment where unprecedentedly high-output microwave-amplifying transistors or MMICs operate stably.

DESCRIPTION OF THE PREFERRED EMBODIMENTS

The following is the detailed explanation of the embodiment of the present invention, referring to the attached drawings. These examples are not to limit the scope of the present invention.

EXAMPLE 1

Figure 1:
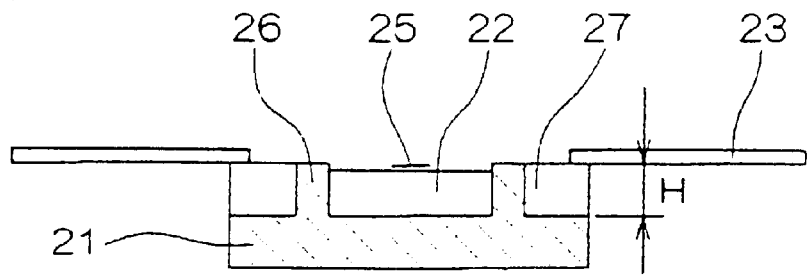
FIG. 1 is a schematic illustration of an embodiment of the package for semiconductors of the present invention; (a) is the cross-sectional view taken on line A—A of plan view (b).
Figure 1:
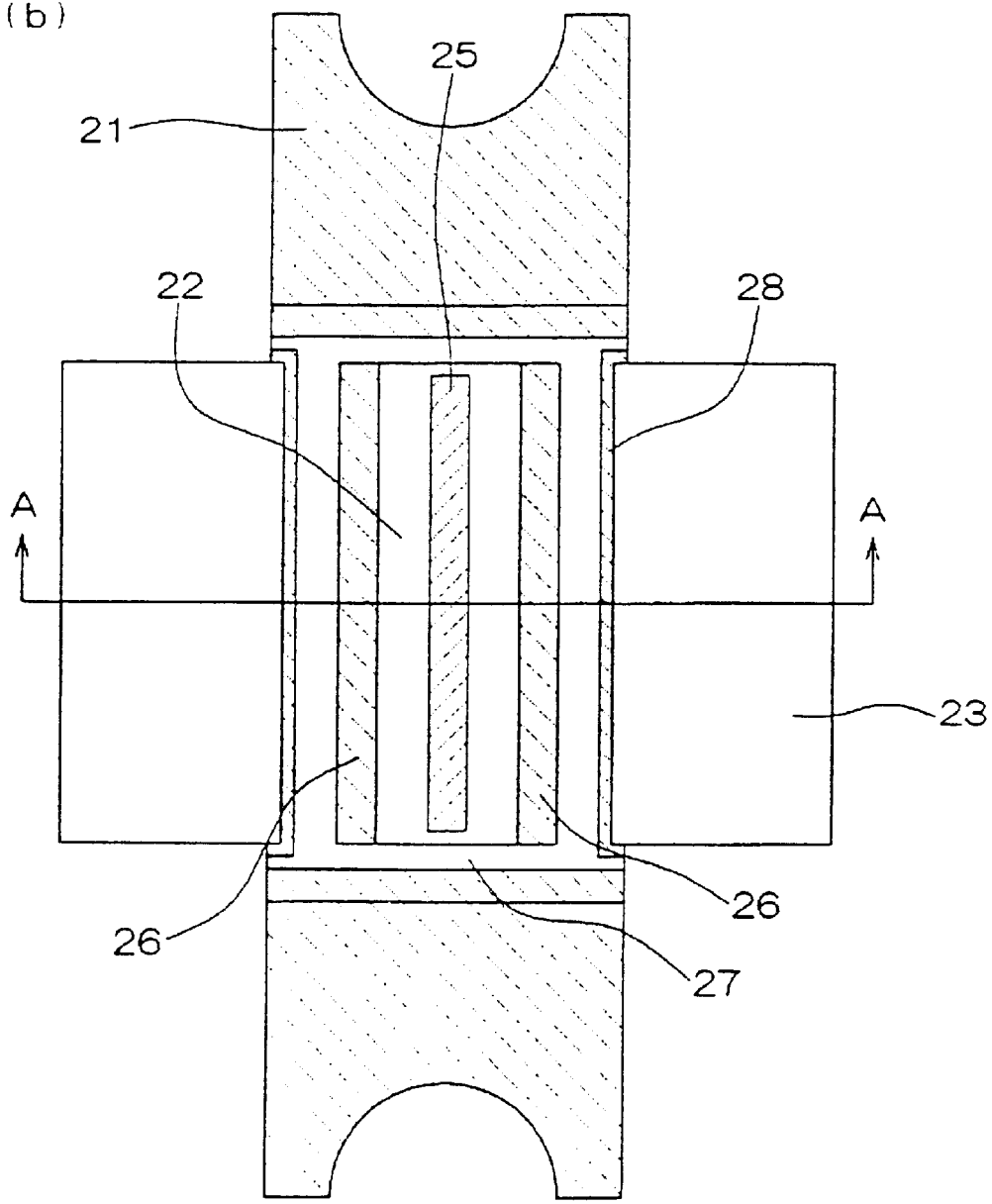

Packages for semiconductors of the present invention were fabricated as shown in FIG. 1. The package has a metallic member 21 with two parallel protuberances 26 separated from each other on the metallic member. Onto the submount portion surrounded by the two protuberances 26, a CVD diamond substrate 22 made of a free standing diamond film formed by vapor-phase synthesis is bonded. Onto the outside portion of the protuberances 26, a frame-shaped ceramic member 27 made of alumina is bonded. The CVD diamond substrate 22 has an area 25 for mounting semiconductor elements on the top thereof, and lead frames 23 are attached onto the top of the ceramic member 27 through metallized layers 28.

This package for semiconductors was fabricated in the following manner: The metallic member 21 made of Cu—W alloy was provided with the two parallel protuberances 26 with a height of H surrounding the submount portion. The ceramic member 27 made of alumina was formed in a frame having a thickness of H in order that it might be fixed just outside the protuberances 26. The metallized layers 28 were prepared on the top of the ceramic member 27 to bond the lead frames by silver solder. The undersurface of the ceramic member 27 was also metallized (not indicated) to bond the same with the metallic member 21 below by silver solder.

The free standing diamond film to be used as the CVD diamond substrate 22 was obtained from the gas synthesis of diamond on an Si substrate by the hot-filament CVD method under the conditions indicated in Table 1 below. Then, the growth surface was polished, and the Si substrate was dissolved and removed by acid. The results of the measurement of the thermal conductivity of the obtained independent diamond laminae by the laser-flash method fell into the range of 1050 to 1150 W/m·K.

TABLE 1

| Material gas | 1.2 vol. % methane-hydrogen |
|---|---|
| Flow rate | 500 sccm |
| Pressure | 80 torr |
| Substrate temperature | 800° C. |
| Filament | Tungsten |
| Filament temperature | 2200° C. |

In order to obtain the CVD diamond substrate 22, a rectangular solid was cut from the free standing diamond film by laser beams so that the same might be fitted into the submount portion surrounded by the protuberances 26 of the metallic member 21. The area 25 for mounting semiconductor elements on the top of the CVD diamond substrate 22 was applied with a metallized layer in the laminated structure of 1 μm Au/0.1 μm Pt/0.05 μm Ti in the order of Ti, Pt, and Au from the bottom layer. The undersurface of the CVD diamond substrate 22 was bonded by AuGe solder onto the submount portion surrounded by the protuberances 26 of the metallic member 21.

As for the dimensions in the foregoing package for semiconductors, the CVD diamond substrate 22 was 3 mm wide, 7 mm long, and 0.3 mm thick; the thickness of the metallic member 21 was 1.5 mm; and the height H of the protuberances 26 was 0.45 mm. On a package thus fabricated, an MMIC chip (heat generation: 60 W) was mounted on the area 25 for mounting semiconductor elements on the top of the CVD diamond substrate 22 to constitute a semiconductor module. The operational results showed that the module had a substantially high heat dissipation, and provided the chip with the ground potential of low inductance, so that the MMIC chip was able to operate stably with high efficiency for an extended duration.

On the other hand, the operational results on the packages having a conventional AlN or BeO substrate, in place of the foregoing CVD diamond substrate 22 made of a free standing diamond film, on the submount portion were that the MMIC chip frequently failed to operate properly due to an excessive temperature rise when the chip's heat generation exceeded 10 W, resulting in the breakdown of the chip.

EXAMPLE 2

Figure 2:
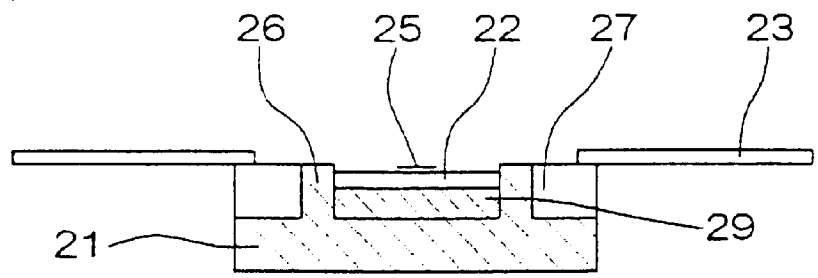
FIG. 2 is a schematic illustration of another embodiment of the package for semiconductors of the present invention; (a) is the cross-sectional view taken on line B—B of plan view (b).
Figure 2:
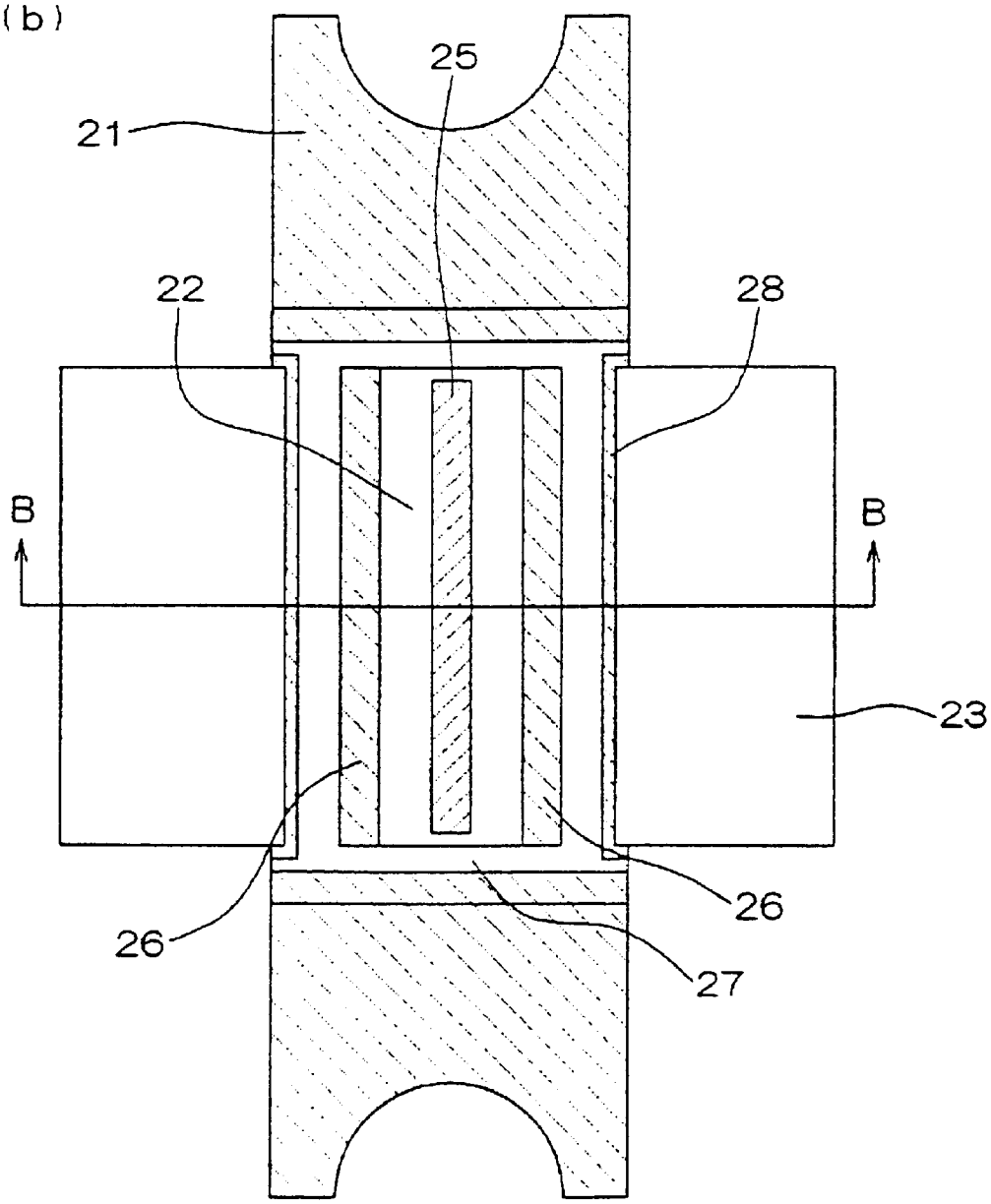
Figure 3:
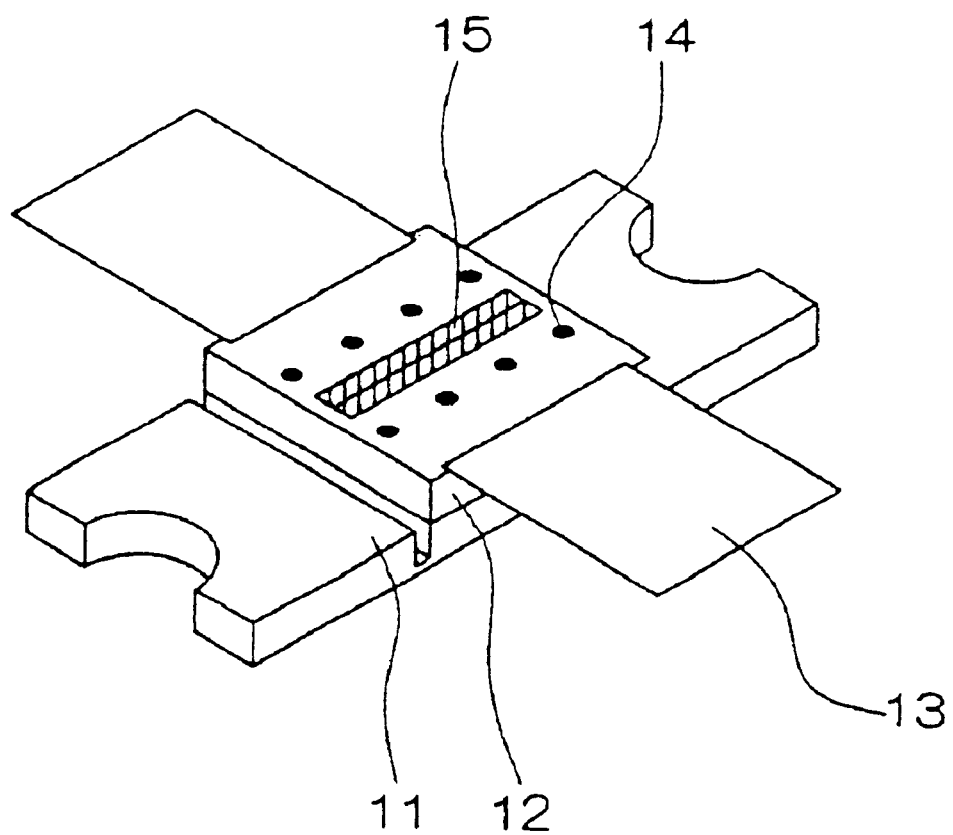
FIG. 3 is a perspective view of an example of conventional packages for semiconductors.
Figure 4:
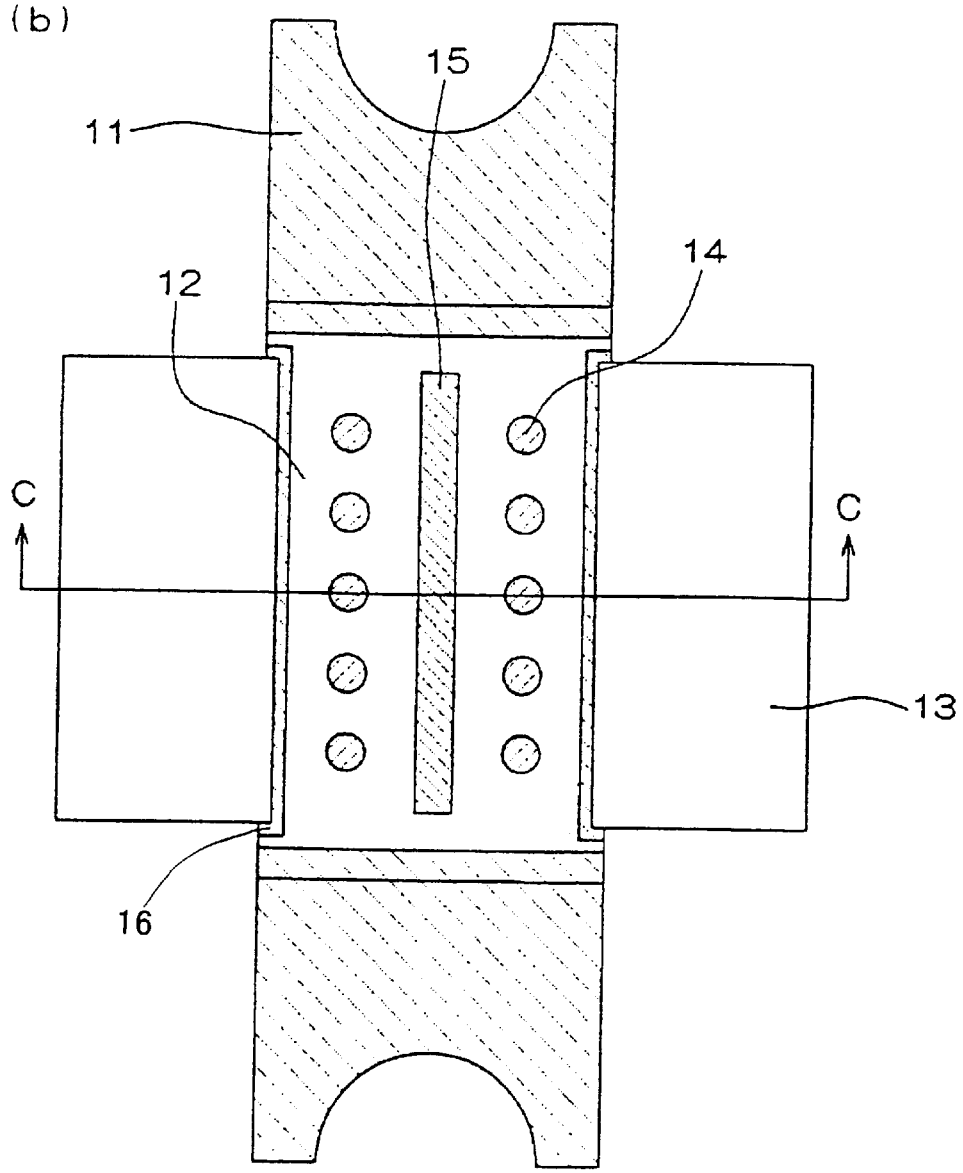
FIG. 4 is a schematic illustration of an example of conventional packages for semiconductors; (a) is the cross-sectional view taken on line C—C of plan view (b).

Packages for semiconductors were fabricated with a base material 29 having a CVD diamond layer 22 on the top of it, as shown in FIG. 2, in place of the CVD diamond substrate 22 made of an independent diamond lamina used in Example 1 above. The fabricating methods and dimensions of the package were the same as Example 1 except the formation method for the CVD diamond layer 22, which is described below.

As the base material 29, Si, AlN, Cu—W alloy, SiC, and $Si_3N_4$ were prepared separately. One entire surface of the base material 29 was made rough using diamond powders to grow diamond on the surface thereof by the hot-filament CVD method. The growing conditions are shown in Table 2 below.

TABLE 2

| Material gas | 0.8 vol. % methane-hydrogen |
|---|---|
| Flow rate | 400 sccm |
| Pressure | 90 torr |
| Substrate temperature | 770° C. |
| Filament | Tungsten |
| Filament temperature | 2250° C. |

Thus the CVD diamond layer 22 was formed with high bonding strength over each base material 29 having a thickness of 0.28 mm. Each CVD diamond layer 22 was polished down to a thickness of 20 μm. All the results of the measurement of the thermal conductivity of the diamond layers 22 by the laser-flash method fell into the range of 1150 to 1250 W/m·K.

After each CVD diamond layer 22 was polished, the sample was cut by laser beams to form a rectangular solid. The rectangular solid was then applied with a metallized layer on the top thereof as with Example 1 and bonded onto the submount portion surrounded by the protuberances 26 of the metallic member 21 as with Example 1 to provide a package for semiconductors.

On each package thus fabricated, an MMIC chip (heat generation: 60 W) was mounted on the area 25 for mounting semiconductor elements on the surface of the CVD diamond layer 22 to constitute a semiconductor module. The operational results showed that the MMIC chip operated stably with high efficiency for an extended duration as with Example 1 except that when $Si_3N_4$ was used as the base material 29, the MMIC chip overheated a few minutes after the start of operation, and broke down. The reason is possibly that the $Si_3N_4$ sintered body has thermal conductivity as low as 20 to 50 W/m·K.

What is claimed is:

1. A package for semiconductor comprising:

a base material having a thermal conductivity of 100 W/m*K or more;

a CVD diamond layer, having a thickness of 5 to 200 μm, formed on at least a part of a surface of the base material for mounting semiconductor elements therein; and a highly heat-conductive metallic member bonded to the base material at a surface opposite to the CVD diamond layer, the metallic member having protuberances around the base material reaching the top of the diamond layer.

2. The package for semiconductors according to claim 1, wherein the base material comprises at least one material selected from the group consisting of Si, AlN, SiC, Cu—W alloy, Cu—Mo alloy, and Cu—W—Mo alloy.

3. A package for semiconductors according to claim 1, wherein a ceramic member made of or mainly consisting of alumina is provided in the package at the places for bonding lead frames.

4. a package for semiconductors according to claim 1, wherein laminated wiring layers, comprising a plurality of combinations of an insulating layer having a dielectric constant of 5 or less and a metallic wiring layer, are formed on the same surface for mounting semiconductor elements of the CVD diamond layer formed on the base material.

5. A semiconductor package according to claim 1, comprising at least one high-output semiconductor element mounted on a surface of the CVD diamond layer formed on the base material of the package for semiconductors.

* * * * *